United States Patent
Kim et al.

(10) Patent No.: US 9,122,626 B2
(45) Date of Patent: Sep. 1, 2015

(54) LINEARLY RELATED THRESHOLD VOLTAGE OFFSETS

(71) Applicant: Seagate Technology LLC, Cupertino, CA (US)

(72) Inventors: Young-Pil Kim, Eden Prairie, MN (US); Rodney Virgil Bowman, Bloomington, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 320 days.

(21) Appl. No.: 13/892,731

(22) Filed: May 13, 2013

(65) Prior Publication Data

US 2014/0334228 A1 Nov. 13, 2014

(51) Int. Cl.
| | |
|---|---|
| G11C 16/04 | (2006.01) |
| G06F 11/10 | (2006.01) |
| G11C 29/02 | (2006.01) |
| G11C 29/42 | (2006.01) |
| G11C 29/50 | (2006.01) |
| G11C 29/52 | (2006.01) |
| G11C 11/56 | (2006.01) |
| G11C 16/00 | (2006.01) |
| G11C 29/04 | (2006.01) |

(52) U.S. Cl.
CPC ........ *G06F 11/1072* (2013.01); *G11C 11/5642* (2013.01); *G11C 29/021* (2013.01); *G11C 29/028* (2013.01); *G11C 29/42* (2013.01); *G11C 29/50004* (2013.01); *G11C 29/52* (2013.01); *G11C 16/00* (2013.01); *G11C 2029/0411* (2013.01)

(58) Field of Classification Search
CPC .............. G11C 16/3481; G11C 16/10; G11C 16/0466; G11C 16/3418; G11C 11/5628; G11C 16/28; G11C 16/06; G11C 16/24; G11C 16/04
See application file for complete search history.

(56) References Cited

U.S. PATENT DOCUMENTS

| | | | |
|---|---|---|---|
| 7,903,468 B2 | 3/2011 | Litsyn et al. | |
| 8,289,781 B2 | 10/2012 | Litsyn et al. | |
| 2008/0106936 A1* | 5/2008 | Yang et al. | 365/185.03 |
| 2008/0192541 A1* | 8/2008 | Kang et al. | 365/185.03 |
| 2009/0067243 A1* | 3/2009 | Takase et al. | 365/185.11 |
| 2012/0099378 A1* | 4/2012 | Cho | 365/185.19 |
| 2012/0134213 A1 | 5/2012 | Choi et al. | |
| 2012/0218823 A1 | 8/2012 | Tanzawa | |
| 2013/0051141 A1 | 2/2013 | Moschiano et al. | |
| 2013/0094293 A1* | 4/2013 | Seol et al. | 365/185.03 |
| 2013/0308393 A1* | 11/2013 | Youn | 365/189.05 |

* cited by examiner

*Primary Examiner* — Hien Nguyen
(74) *Attorney, Agent, or Firm* — Hollingsworth Davis, LLC

(57) ABSTRACT

Threshold voltage offsets for threshold voltages are determined. The threshold voltage offsets may be linearly related by a non-zero slope. The threshold voltages are shifted using their respective threshold voltage offsets. The threshold voltages that are shifted by their respective threshold voltage offsets are used to read data from multi-level memory cells.

20 Claims, 13 Drawing Sheets

LINEARLY RELATED THRESHOLD VOLTAGE OFFSETS

TECHNICAL FIELD

This application relates generally to memory devices as well as articles and systems that incorporate such memory devices, and methods pertaining to such memory devices.

SUMMARY

Some embodiments are directed to a method for use with multi-level memory cells. Threshold voltage offsets for threshold voltages are determined. The threshold voltage offsets may be linearly related by a non-zero slope. According to various embodiments, the threshold voltages are shifted using their respective threshold voltage offsets. The threshold voltages that are shifted by their respective threshold voltage offsets are used to read data from the multi-level memory cells.

In some cases, a slope and a pivot are selected that linearly relate a set of threshold voltage offsets for a set of threshold voltages. Data is read from the multi-level memory cells using the threshold voltages shifted by their respective threshold voltage offsets. According to some aspects, a bit error rate (BER) of the multi-level memory cells is determined using the shifted threshold voltages. It may be determined whether the BER is an optimal BER. If the BER is non-optimal, an additional slope and pivot that linearly relate one or more additional threshold voltages is selected iteratively. Additionally or alternatively, if the BER is non-optimal, the bit error rate is iteratively determined using the set of threshold voltages shifted by the additional threshold voltage offsets.

According to various embodiments described herein, a memory controller comprises a threshold voltage analyzer configured to determine a set of threshold voltage offsets for a set of threshold voltages for multi-level memory cells. In some cases, the set of threshold voltage offsets is linearly related by a non-zero slope. According to various aspects, the memory controller includes a memory interface configured to send information about the shifted threshold voltage offsets to memory read circuitry and to receive data read from the memory cells using the set of threshold voltages shifted by their respective threshold voltage offsets.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
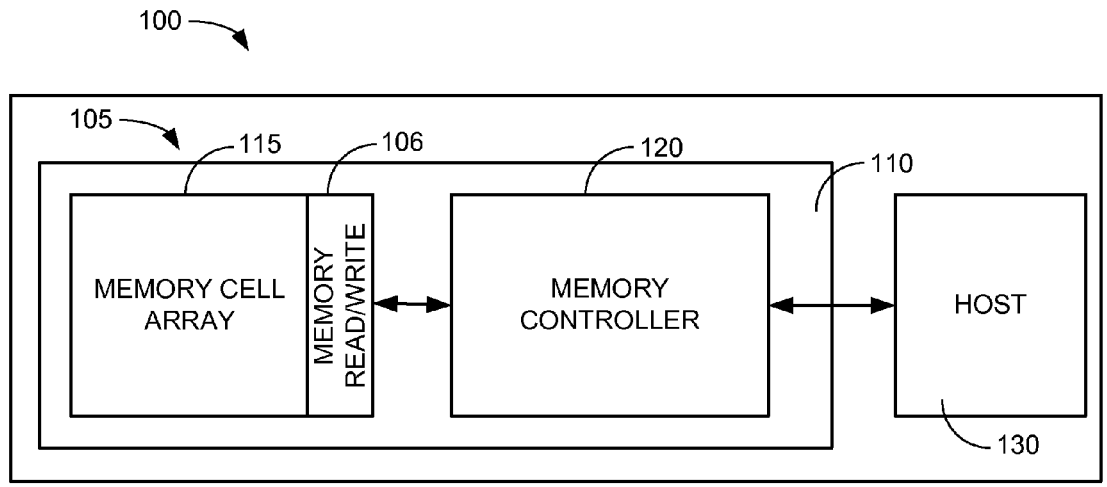
FIGS. 1A-1C are block diagrams of a system capable of adjusting one or more $V_T$ values according to embodiments described herein.

Non-volatile memory devices are capable of retaining stored data for relatively long periods of time, even in the absence of external power. Non-volatile, solid-state memory includes floating gate memory, e.g., flash memory, which programs data into memory cells by applying a voltage to the memory cell, the applied voltage causing a charge to be stored on a floating gate of a transistor. The data can be read later from the memory cell by sensing the voltage of the transistor and comparing the sensed voltage to a read threshold voltage, $V_T$.

Memory cells are known to exhibit errors caused, for example, by charge leakage, manufacturing defects, and disturb effects. These errors may be manifested as bit errors in the decoded data. A memory device may use a number of measures to account for these errors, such as error correction codes (ECC) that utilize extra data for detecting and correcting bit errors. The memory device may determine a bit error rate (BER) based on ECC activity and can use the BER to analyze system performance.

Memory devices may comprise single-level memory cells or multi-level memory cells. Single level cell (SLC) memory uses memory cells that store one bit of data per cell. Data is read from the SLC by sensing the voltage of the memory cell and comparing the sensed voltage to a threshold voltage. If the sensed voltage is greater than the threshold voltage, it is determined that the bit is in a first state, e.g., the "0" state, and if the sensed voltage is less than the threshold voltage, it is determined that the bit is in a second state, e.g., the "1" state. In multi-level cell (MLC) memory, the memory cells can be programmed to store two or more bits of information. For example, a two bit MLC is capable of storing four two bit symbols, 00, 01, 10, 11, each symbol corresponding to a different voltage level stored in the memory cell.

In general, a memory cell may be programmed to a number of voltages, M, where M can represent any of $2^m$ memory states. The value m is equal to the number of bits stored, and m is greater than 1 for MLC memory. For example, memory cells programmable to four voltages can store two bits per cell (M=4, m=2); memory cells programmable to eight voltages have a storage capacity of three bits per cell (M=8, m=3), etc.

The memory cells of a memory device can be grouped into data units referred to herein as data pages or blocks. A data page can correspond, for example, to a group of memory cells that are read together during a read operation. A group of memory pages that are erased at substantially the same time may be referred to as a block or erasure unit. Memory cells are programmed in units of pages and, after programming, the pages are not re-programmed until after the block of pages is erased. Garbage collection operations can be performed on the blocks of pages, wherein the blocks are erased after active data stored in each block is moved to another location. Thus, as a result of garbage collection, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

Charge loss or charge gain in the memory cells may lead to data errors such that data read from the memory cells does not correspond to the originally stored data. The number of errors can be decreased by modifying the read threshold voltages ($V_T$) used to read data stored in the memory cells. Charge loss occurs when charge leaks from the floating gate of the memory cell causing the voltage of the memory cell to shift in the negative voltage (−ve) direction. Disturb effects can occur when neighboring cells are read or programmed. Disturb effects can cause the voltage of the memory cell to shift to the positive voltage (+ve) direction. Thus, a search scheme may be developed to attain optimal $V_T$ values used to read the voltage of the memory cells during operation of the memory device.

Determining optimal offsets to apply to $V_T$ values used to read the memory cells can help reduce BER. Efficient determination of the $V_T$ offsets can reduce processing time. Embodiments disclosed herein involve a slope-based determination of optimal $V_T$ offsets that is time efficient and reduces BER. Embodiments discussed herein involve selecting a slope that relates the offsets for each of a plurality of $V_T$ values used to read a multi-level memory cell. The $V_T$ values for the multi-level cell are shifted by their respective offsets and are used to read data from the multi-level memory cells.

FIG. 1A is a block diagram of a system 100 capable of storing data in memory cells and later retrieving the data stored in the memory cells. The process of retrieving data stored in the memory cells can include adjusting one or more $V_T$ values used to read data stored in the memory cells to achieve BERs less than a predetermined value. A system 100 configured to implement adjustment of the $V_T$ values according to approaches discussed herein includes a memory device 110 that may be coupled for communication with a host processor 130. The memory device 110 comprises a memory controller 120 and a memory 105 that includes a memory cell array 115 and read write circuitry 106 configured to generate signals that cause data to be written to or read from memory cells of the memory cell array 115. The memory device 110 may be arranged to communicate with a host 130.

The block diagram of FIG. 1A and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, alternative embodiments may provide all or a portion of the functionality of the memory controller 120 within the host 130. Other implementations may encompass the read/write element 106 included with the functions of the memory controller 120. The various approaches described herein may be implemented using hardware, software, or a combination of hardware and software. Memory chips, controller chips and/or chips of the host computer may contain one or more of the functional elements discussed herein, for example.

Figure 1B:
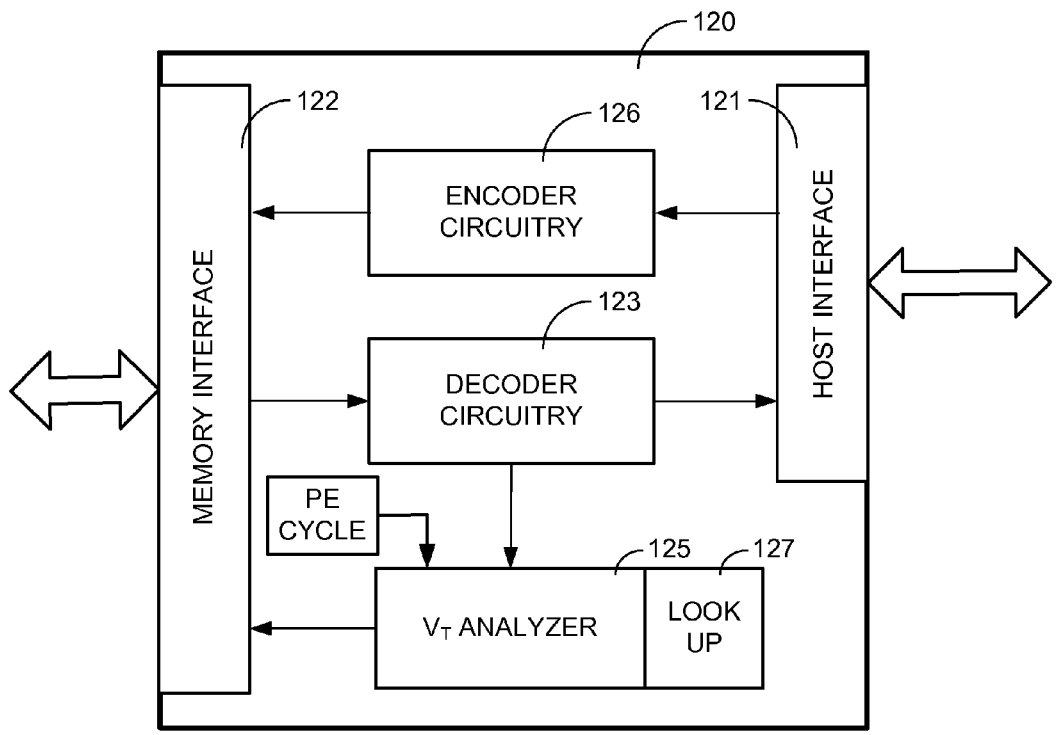

FIG. 1B provides a more detailed view of the memory controller 120 of FIG. 1A including a threshold voltage ($V_T$) analyzer in accordance with some embodiments discussed herein. The memory controller 120 shown in FIG. 1B comprises a host interface 121, a memory interface 122, encoder circuitry 126, decoder circuitry 123 and a $V_T$ analyzer 125. The memory interface 122 serves to permit the memory controller 120 to communicate with the memory device 110. The host interface 121 serves to permit communication between the memory controller 120 and the host 130. The host interface 121 passes data that is to be stored in the memory device 110 to the encoder circuitry 126. The encoder circuitry 126 encodes the data using an error correcting code (ECC) and provides the encoded data to the memory interface 122. To implement write operations, the memory read/write element 106 receives the encoded data from the memory interface 122 and generates signals that cause the encoded data to be stored in memory cells of the memory array 115. To implement read operations, the memory read/write circuitry 106 senses the voltages of the memory cells in the memory array 115, and compares the sensed voltages to one or more threshold voltages, $V_T$s. By comparing the sensed voltage of the cell to the $V_T$s the voltage level of the memory cell can be ascertained. The voltage level represents the data stored in the memory cells of the memory cell array 115. The memory interface 122 passes data that is read from the memory cell array 115 to the decoder circuitry 123. The data read from the memory cells is decoded by the decoder and the decoded data can be transmitted through the host interface 121 to the host 130. The voltage threshold analyzer 125 is configured to determine a set of threshold voltage offsets for a set of threshold voltages for multi-level memory cells, the set of threshold voltage offsets being linearly related by a non-zero slope and pivot value. The memory interface is configured to send information about the shifted threshold voltage offsets to memory read circuitry and to receive data read from the memory cells using the set of threshold voltages shifted by their respective threshold voltage offsets. The decoder 123 is configured to decode the data and to determine a bit error rate for the data. The voltage threshold analyzer 125 is configured to use the bit error rate provided by the decoder 123 to determine the set of threshold voltage offsets that provide a set of optimal threshold voltages. The set of optimal threshold voltages produce an optimal BER.

In some embodiments, the decoder circuitry 123 and the $V_T$ analyzer 125 operate in cooperation with other system components in an iterative manner using different $V_T$ values during each iteration to determine an optimal $V_T$ value that results in a lower BER than a BER initially obtained with an initial $V_T$. Once an optimal $V_T$ is determined by the iterative process, the data read with the optimal $V_T$. The data read with the optimal $V_T$ may be decoded using the decoder and the decoded data transmitted through the host interface 121 to the host 130.

According to various implementations described herein, the $V_T$ analyzer 125 is configured to determine an optimal $V_T$, e.g., using an iterative process as discussed above, by determining the value of an offset from a previously used $V_T$ value. In some embodiments, the $V_T$ analyzer 125 determines a slope and/or pivot that relates the threshold voltage offsets for each of a plurality of $V_T$ values used to read a multi-level memory cell. In some cases, the $V_T$ analyzer 125 is configured to determine a BER of the multi-level cells using a set of threshold voltages ($V_T$s) shifted by these slope-related threshold voltage offsets and compare the BER obtained using the $V_T$s shifted by the slope-related offsets to a predetermined BER value. The $V_T$ analyzer 125 may iteratively change the slope of the slope-related offsets until the BER is less than the predetermined value and/or until the BER reaches an optimal or minimal level. Data that has an optimal BER or BER less than the predetermined value is output to the host. The slope and pivot that linearly relate the threshold voltage offsets may be selected for the iteration from a look up table 127.

Figure 1C:
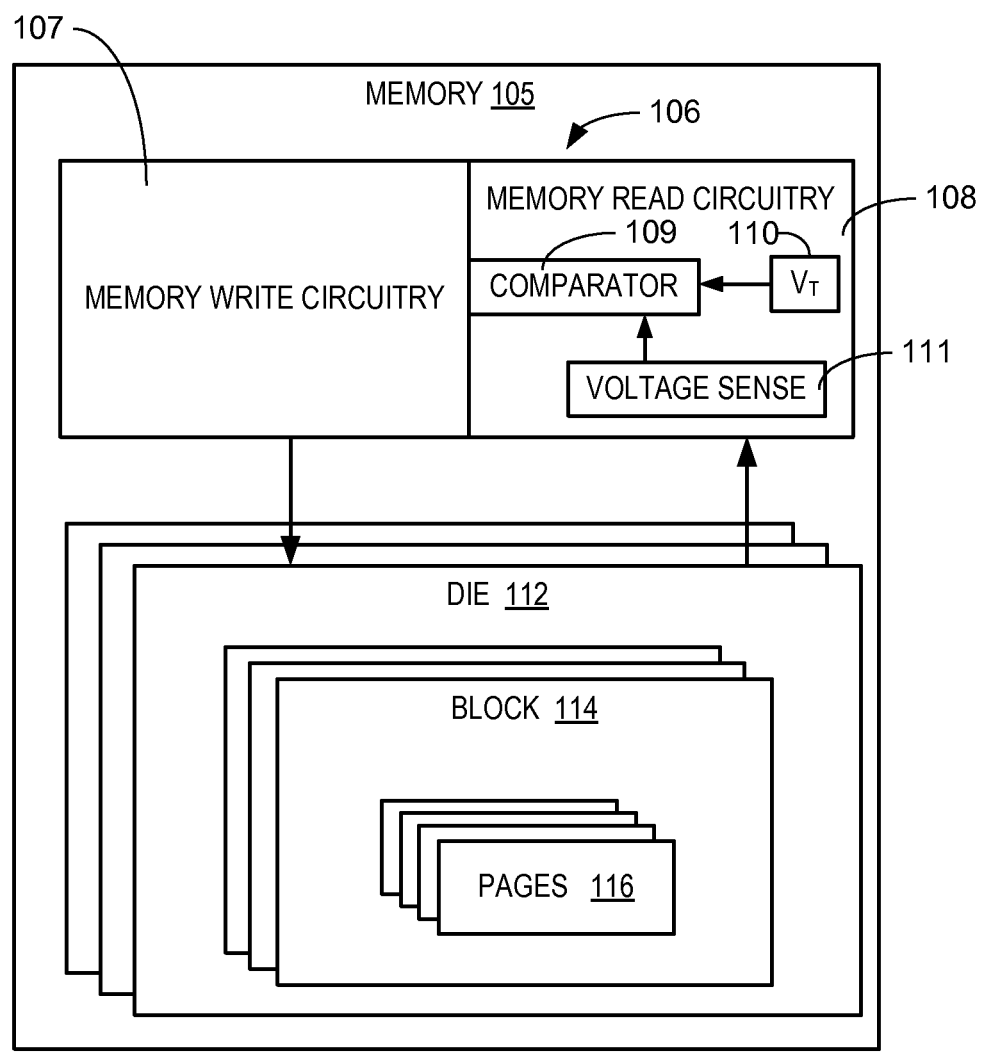

FIG. 1C provides a more detailed view of the memory 105 of FIG. 1A. The memory includes memory cells arranged in pages 116, blocks 114, and die 112 and memory read/write circuitry 106. The memory read/write circuitry includes memory write 107 and memory read circuitry 108. The memory write circuitry 107 provides signals that cause the data to be written the memory cells for storage. The memory read circuitry 108 is capable using different $V_T$s to read the voltage on the memory cells and thus obtain data stored in the memory cells.

Reading a multilevel memory cell involves comparing the sensed voltage level to a set of $V_T$s. A voltage of multi-level memory cell may be read using a set of threshold voltages $V_{Tj}$, where j=1, 2, ... M−1. In one approach, different read operations are performed with different $V_T$ sets, wherein each $V_T$ in the set is shifted by an offset. The set of threshold voltages $V_{Tj}$, where j=1, 2, ... M−1 is shifted by its respective offset, $\Delta V_{Tj}$, where j=1, 2, ... M−1. Each of the $\Delta V_T$s in the set $\Delta V_{Tj}$, where j=1, 2, ... M−1 are linearly related by a slope. The BERs associated with each of the $V_T$ sets is determined, and the BERs are used to determine the $V_T$s set with the lowest or optimal BER.

For example, consider the voltage distributions 202, 203, 204, 205 of a two-bit per cell MLC memory as shown in FIG. 2. A two-bit per cell memory has four possible states, corresponding to four data symbols 11, 10, 00, 01. Each symbol corresponds to a particular voltage level. When memory cells are programmed, the cells are charged to a target voltage level corresponding to the data being stored. The number of memory cells across a the memory (or a unit of memory such as a page) corresponding to each state 11, 10, 00, 01 can be assumed fall into a Gaussian distribution, as shown in FIG. 2. Assuming a Gaussian distribution, when the voltages are read from the memory cells, the sensed voltages of memory cells of a page (or other unit) of the MLC memory device may be distributed around the target voltage levels and fall within voltage distributions 202-205, respectively. Voltage distribution 202 includes the voltages of the memory cells corresponding to symbol 11, distribution 203 includes the voltages of the memory cells corresponding to symbol 10, voltage distribution 204 includes the voltages of the memory cells corresponding to symbol 00, and voltage distribution 205 includes the voltages of the memory cells corresponding to symbol 01.

Figure 2A:
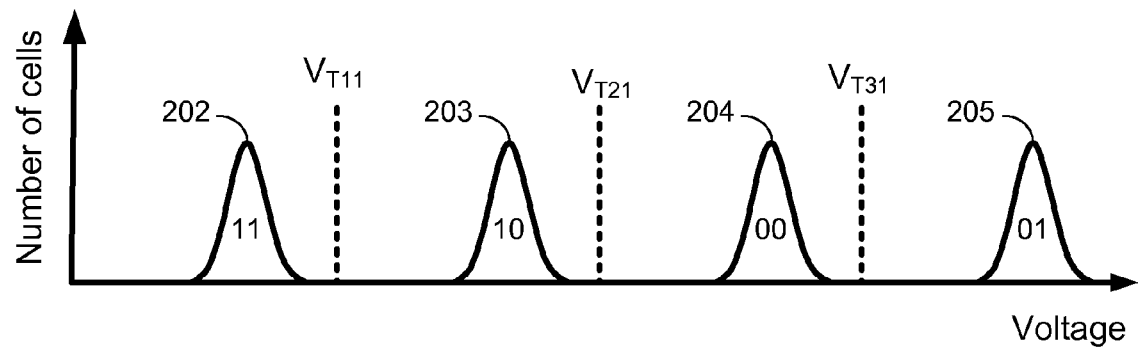
FIG. 2A shows an example of the voltage distribution of data stored a two-bit per cell multi-level cell (MLC) device.
Figure 2B:
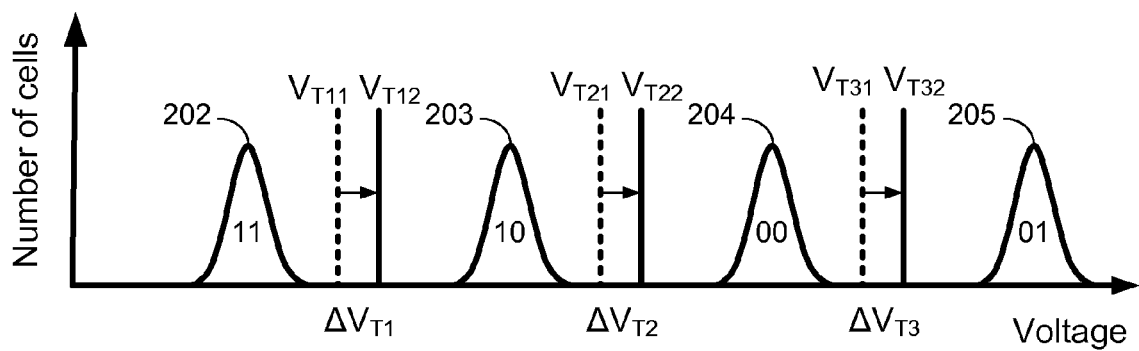
FIG. 2B shows threshold voltage offsets for a two-bit per cell MLC device.

As shown in FIG. 2A, $V_{T11}$, $V_{T21}$, $V_{T31}$ are a set of read threshold voltages that are used to read the memory cells to determine which symbols are stored in the cells. For example, after the voltage corresponding to the symbol 10 is applied to a cell during a program operation, the symbol 10 is said to be programmed into the cell. At a later time, the voltage of the cell is sensed and the sensed voltage is compared to read threshold voltages to read the symbol stored in the cell. During a read operation, the sensed voltage may first be compared to $V_{T2}$. If the comparison to $V_{T2}$ determines that the sensed voltage is less than $V_{T2}$, then the symbol stored in the cell is either 11 or 10. The sensed voltage may next be compared to $V_{T1}$. If the sensed voltage is greater $V_{T1}$, then the symbol stored in the cell is 10. However, if the sensed voltage for this cell deviates from the voltage value programmed into the cell, then an error occurs when the cell is read. For example, if the cell was programmed to be to a voltage less than $V_{T1}$, (corresponding to symbol 11) but the voltage read from the cell during a subsequent read corresponds to data symbol 10, then an error occurs.

Charge stored in a memory cell may need to be retained for months or years, e.g., longer than 10 years, even in the absence of power. Even a low charge leakage rate from the memory cell can cause data errors to occur if the retention time, τ, is substantial. Disturb effects may occur when the charge stored on the floating gate of a transistor memory cell is disturbed unintentionally by local electrical signals present when other memory cells are erased, written to (programmed), and/or read. Deviations between programmed voltages and sensed voltages are considered noise and can be modeled using noise statistics. The noise associated with the data in a page may be a function of PE, for example.

Generally, a variety of error correction code (ECC) algorithms are known that can correct a known number of bit errors for a predefined word size and number of ECC bits. Memory systems may use multiple levels of error coding (e.g., inner and outer coding) to improve overall error correction performance. The BER is used to gauge the performance of the memory in general. Soft information can be used by some types of decoders, e.g., LDPC decoders, and provides a measure on the reliability of a bit being a "0" or a "1". The soft information can be used to develop a log likelihood ratio (LLR) which represents the bit read from the memory cell along with reliability information. The soft information can be developed in various ways, e.g., based on a noise distribution of the channel or by multiple reads of the memory cells.

Although ECC can be used to detect and correct some errors, the use of optimal $V_T$s used to read memory cells can reduce the number of errors that need to be detected and/or corrected. To determine an optimal set of $V_T$ values for MLC devices, a set of offsets, may be applied to a set of previously used $V_T$s. For example, referring to FIG. 2B, a set of offsets, $\Delta V_{T1}$, $\Delta V_{T2}$, $\Delta V_{T3}$ may be applied to the set of $V_T$s, $V_{T11}$, $V_{T21}$, $V_{T31}$. The resulting set of $V_T$s after offsets $\Delta N_{T1}$, $\Delta V_{T2}$, $\Delta V_{T3}$ are applied is $V_{T12}$, $V_{T22}$, $V_{T32}$.

Figure 3:
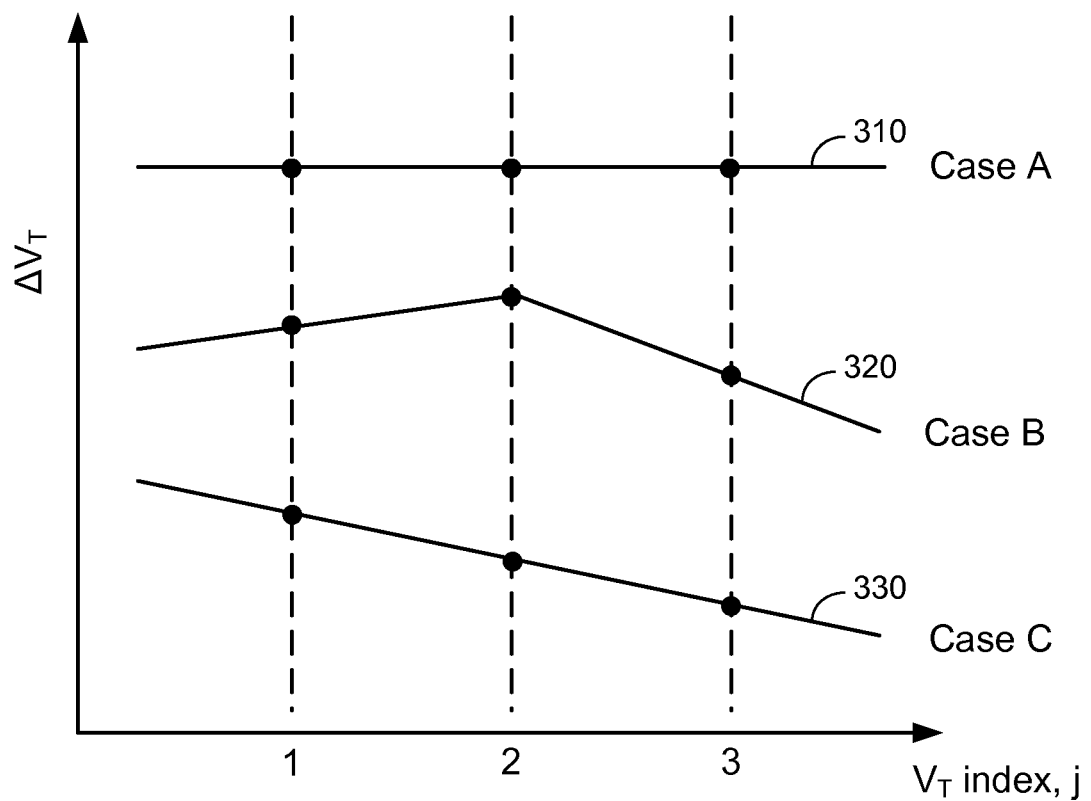
FIG. 3 illustrates three techniques of optimizing threshold voltages shifts for three threshold voltages in a MLC.

FIG. 3 illustrates three techniques of optimizing threshold voltages offsets for a set of three threshold voltages in a MLC. Case A 310 illustrates an example in which all of the voltage threshold offsets, $\Delta V_{T1}$, $\Delta V_{T2}$, and $\Delta V_{T3}$ are the same for any $V_{Tj}$, where j is the index of the threshold voltage for a multi-level cell. For Case A shown in FIG. 3, $\Delta V_{T1} = \Delta V_{T2} = \Delta V_{T3}$. Such an implementation can be accomplished, for example, by selecting a voltage offset for one of the $V_T$s and using that same voltage offset for each of the other $V_T$s in the set. In this implementation, the offsets $\Delta V_{T1}$, $\Delta V_{T2}$, and $\Delta V_{T3}$ are linearly related and the slope is 0.

Case B 320 illustrates an example in which all of the voltage offsets $\Delta V_{T1}$, $\Delta V_{T2}$, and $\Delta V_{T3}$ are selected independently from one another and may not be linearly related. This method may allow for more accurate voltage offsets than for Case A 310, but also may be more inefficient because each one of the three voltage offsets has to be independently determined.

Case C 330 illustrates an example in which some or all of the voltage offsets are linearly related by a non-zero slope. In this embodiment, once one of the $V_T$ offsets ($\Delta V_T$s) is determined, e.g., $\Delta V_{T2}$, the remaining $\Delta V_T$s, e.g., $\Delta V_{T1}$ and $\Delta V_{T3}$, can be determined based on the known $\Delta V_T$ and the slope that relates the $\Delta V_T$s. This technique can be optimal with respect to efficiency and accuracy because it can be more efficient than separately choosing voltage shift for each of the threshold voltages as in case B 320, and it can be more accurate than choosing the same voltage shift for each of the threshold voltages as in case A 310.

Figure 4A:
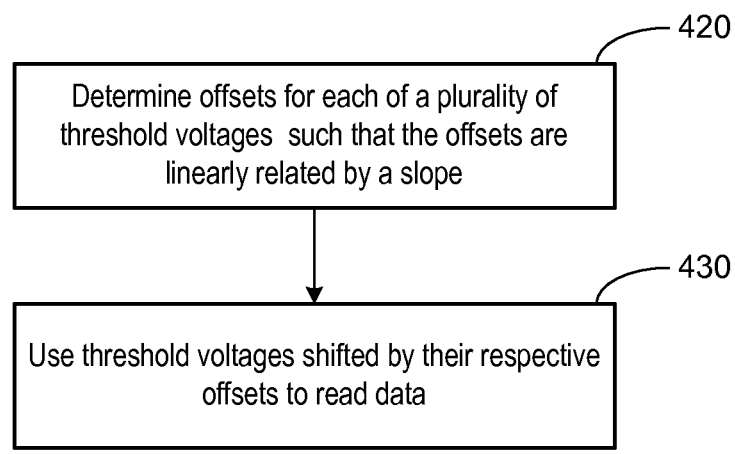
FIGS. 4A and 4B provide flow diagrams of methods in accordance with some embodiments.
Figure 4B:
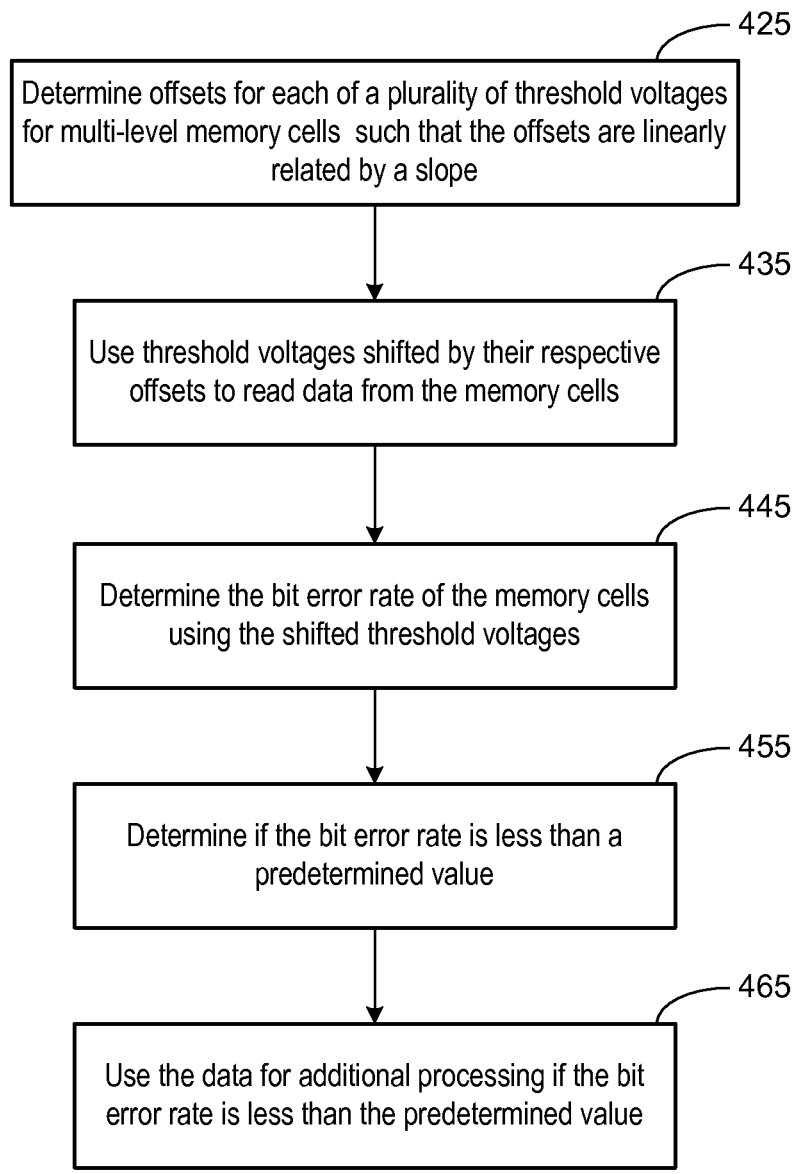

FIGS. 4A and 4B provide flow diagrams of methods in accordance with some embodiments. These methods can be implemented in hardware, software or a combination thereof in the memory controller as shown in FIGS. 1A-1B. According to FIG. 4A, $V_T$ offsets ($\Delta V_T$s) are determined 420 for each of a plurality of threshold voltages ($V_T$s) such that the $\Delta V_T$s are linearly related by a non-zero slope. In some cases, the plurality of $\Delta V_T$s that are linearly related by the non-zero slope is at least three threshold voltages. The slope may be selected based on a number of PE cycles experienced by the memory cells and/or a previous bit error rate (BER) of the memory cells. For example, a look up table may be used to facilitate selection of the slope base on PE cycles, BER and/or other factors for example. In some case the look up table can store predefined slopes that are associated with a total number of PE cycles experienced by the memory cells. For example, if the cells have experienced a higher number of PE cycles, the slope used to determine the $\Delta V_T$s can be a higher slope compared to the slope used to determine the $\Delta V_T$s for if the cells have experienced a lower number of PE cycles. Threshold voltages shifted by their respective offsets are used 430 to read the data. The process illustrated in FIG. 4A and other flow diagrams included herein are implementable by structures shown in FIGS. 1A-1C.

The flow diagram of FIG. 4B illustrates a process for determining optimal $V_T$ offsets and using the optimal $V_T$ offsets to read data stored in memory cells. $V_T$ offsets are determined 425 for each of the plurality of threshold voltages for multi-level memory cells such that the offsets are linearly related by a non-zero slope. Threshold voltages shifted by their respective $V_T$ offsets are used 435 to read the data. The BER of the multi-level memory cells is determined 445 from the data read using the $V_T$s shifted by their respective optimal $V_T$ offsets. A determination 455 is made regarding whether the BER of the memory cells is less than a predetermined value. The BER can be the BER across a page of the multi-level memory cells, for example. If the BER is less than the predetermined value, the errors are able to be corrected by an ECC process, for example. In some cases a suitable predetermined value of BER is about 40 bits in 1 KB size of data, for example. The data may be transferred to the host and/or used 465 for additional processing if the BER is less than the predetermined value. If the BER is equal to or greater than the predetermined value, a different slope may be selected based on the BER. The $V_T$s may be determined using the new $V_T$ offsets, and the data read using the $V_T$s shifted by the new $V_T$ offsets. This process may continue until a determination is made that the BER is less than the predetermined value. In some cases, if the BER is still greater than or equal to the predetermined value, the process may continue for several iterations, reading memory cells using $V_T$ offsets determined by selecting several additional slopes that linearly relate the $V_T$ offsets.

Figure 5:
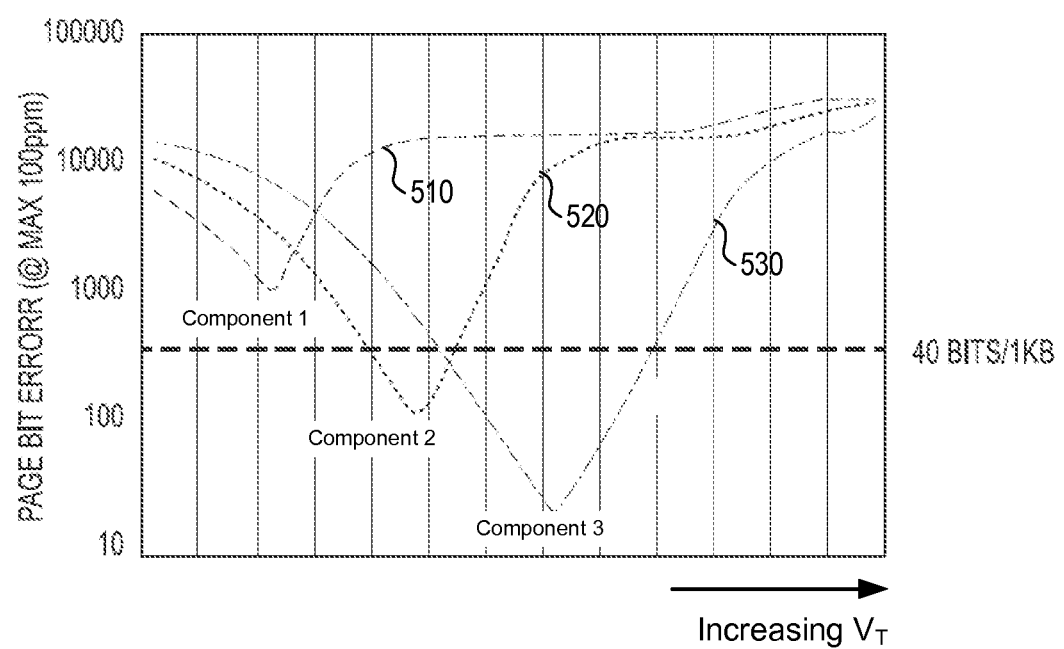
FIG. 5 shows a graph that illustrates the bit error rate (BER) in relation to the retry voltage with three different slopes.

FIG. 5 shows a graph that illustrates the variation in BER as a function of $V_T$ for three different electronic components Component 1, Component 2, Component 3, where the $V_T$s for these components are adjusted using equal $\Delta V_T$s as in the technique of Case A shown in FIG. 3. In this example, a predetermined BER threshold was chosen at 40 bits/1 KB. The BER as a function of increasing $V_T$s for Component 1 (shown by line 510) did not drop below the BER threshold for any value of $V_T$s tested. The BER as a function of increasing $V_T$s for Component 2 (shown by line 520) did drop below the BER threshold for some values of $V_T$s tested. The BER as a function of increasing $V_T$s for Component 3 (indicated by line 530) dropped even further below the BER threshold. The graphs of FIG. 5 show that BER with respect to the set of $V_T$s used to read the cells varies from component to component, thus it would be expected that optimal values for the set of $V_T$s also varies from component to component.

As previously discussed, the $\Delta V_T$s used in embodiments described herein are linearly related. Thus, the $\Delta V_T$s described in the embodiments are related according to the equation: $\Delta V_{Tj} = a(j-1) + x$, where $j=1, 2, \ldots M-1$, and M is the number of memory states of the memory cell. In this equation, a is the slope of the linear relationship and x is the intercept, referred to herein as the "pivot". In some implementations, both the slope and the pivot can be chosen and used to calculate the $\Delta V_T$s. In some embodiments, the slope and pivot values can be selected from a look up table, where the selection of the slope and pivot is based on one or more parameters of the memory cells, e.g., BER, number of PE cycles experienced, retention time, operating temperature, history of operating and/or storage temperature, number of reads of a memory unit after the last program, etc. In some embodiments, the selected slope and pivot values may be calculated using an equation wherein the slope and/or pivot are a function of one or more of the parameters of the memory cells.

Figure 6A:
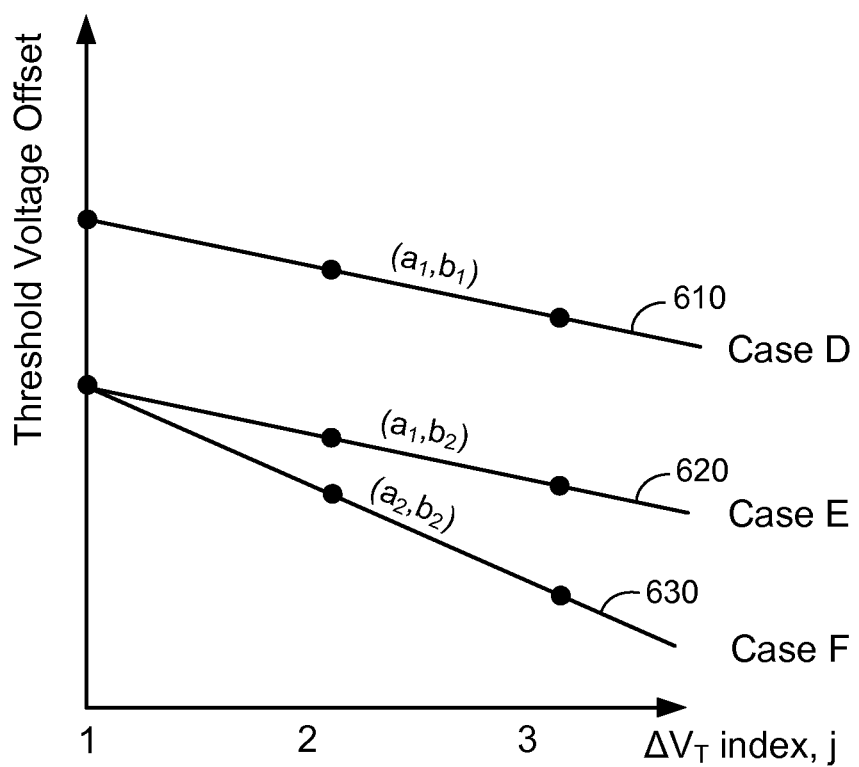
FIG. 6A provides a graph representing three different scenarios resulting in different outcomes for at least two of the threshold voltage offsets.

FIG. 6A shows a graph representing three different scenarios resulting in different outcomes for at least two $\Delta V_T$s of a set of $\Delta V_{Tj}$, where $j=1, 2, \ldots M-1$ when different slopes and/or pivot values are used. In these scenarios, the pivot values correspond to values of the first threshold voltage offset, $\Delta V_{T1}$. In this particular example, the pivot $\Delta V_T$ is $\Delta V_{T1}$, however, it will be appreciated that any of $\Delta V_{T1}$, $\Delta V_{T2}$, $\Delta V_{T3}$ may serve as the pivot $\Delta V_T$. In the scenarios shown in FIG. 6A, the memory cells have four possible states corresponding to four voltages and are capable of storing two bits. Reading the memory cells requires a set of three $\Delta V_T$s ($\Delta V_{T1}$, $\Delta V_{T2}$, $\Delta V_{T3}$). Case D 610 shows $\Delta V_{T1}$, $\Delta V_{T2}$, $\Delta V_{T3}$ determined by choosing a slope $a_1$ and pivot $b_1$. Case E 620 is another example that shows $\Delta V_{T1}$, $\Delta V_{T2}$, $\Delta V_{T3}$ determined by choosing ($a_1$, $b_2$) corresponding to a slope=$a_1$ (the same slope as in Case D and pivot value=$b_2$. In Case E, the slope is the same as in Case D, but the pivot value is different as can be observed from the lines 610, 620. Case F 630 illustrates an example in which $\Delta V_{T1}$, $\Delta V_{T2}$, $\Delta V_{T3}$ are determined by choosing ($a_2$, $b_2$) corresponding to a slope=$a_2$ and pivot=$b_2$. In Case F, the slope $a_2$ is different from the slope of both Case D 610 and Case E 620, but the pivot $b_2$ is the same as in Case E 620.

Figure 6B:
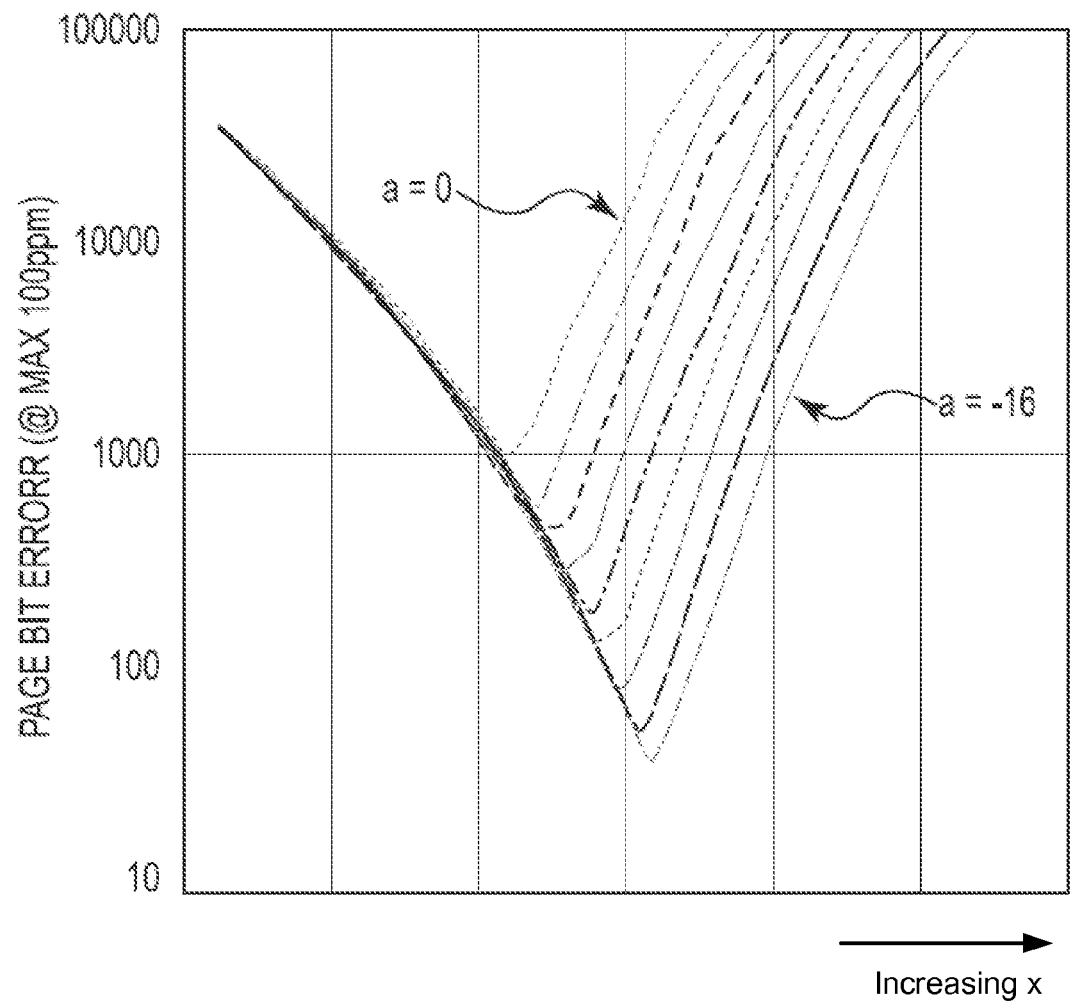
FIG. 6B illustrates a graph that shows the BER in relation to the retry voltage.
Figure 6C:
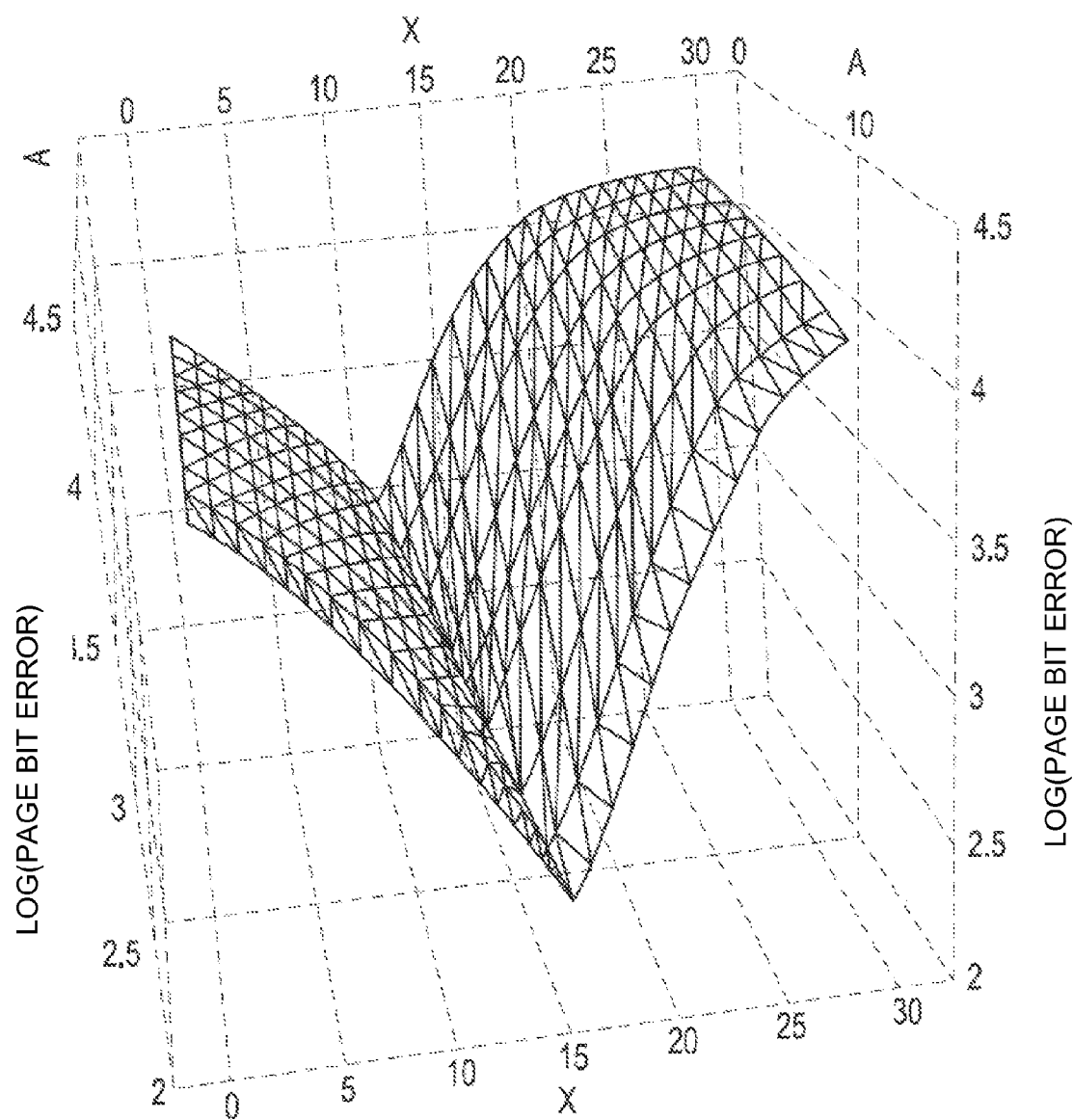
FIG. 6C is a three dimensional representation of the data shown in FIG. 6B.

FIG. 6B illustrates a two dimensional family of curves showing the number of bit errors with respect to the pivot value, x, for a family of slopes a=0 to a=−16. According to the example provided by the family of curves shown in FIG. 6B, the minimum bit error achievable is reduced with an increasing (negative) slope. FIG. 6C is a three dimensional representation of the data shown in FIG. 6B. In FIG. 6C, the log of the page bit error is graphed as a function of slope and pivot value.

Figure 7A:
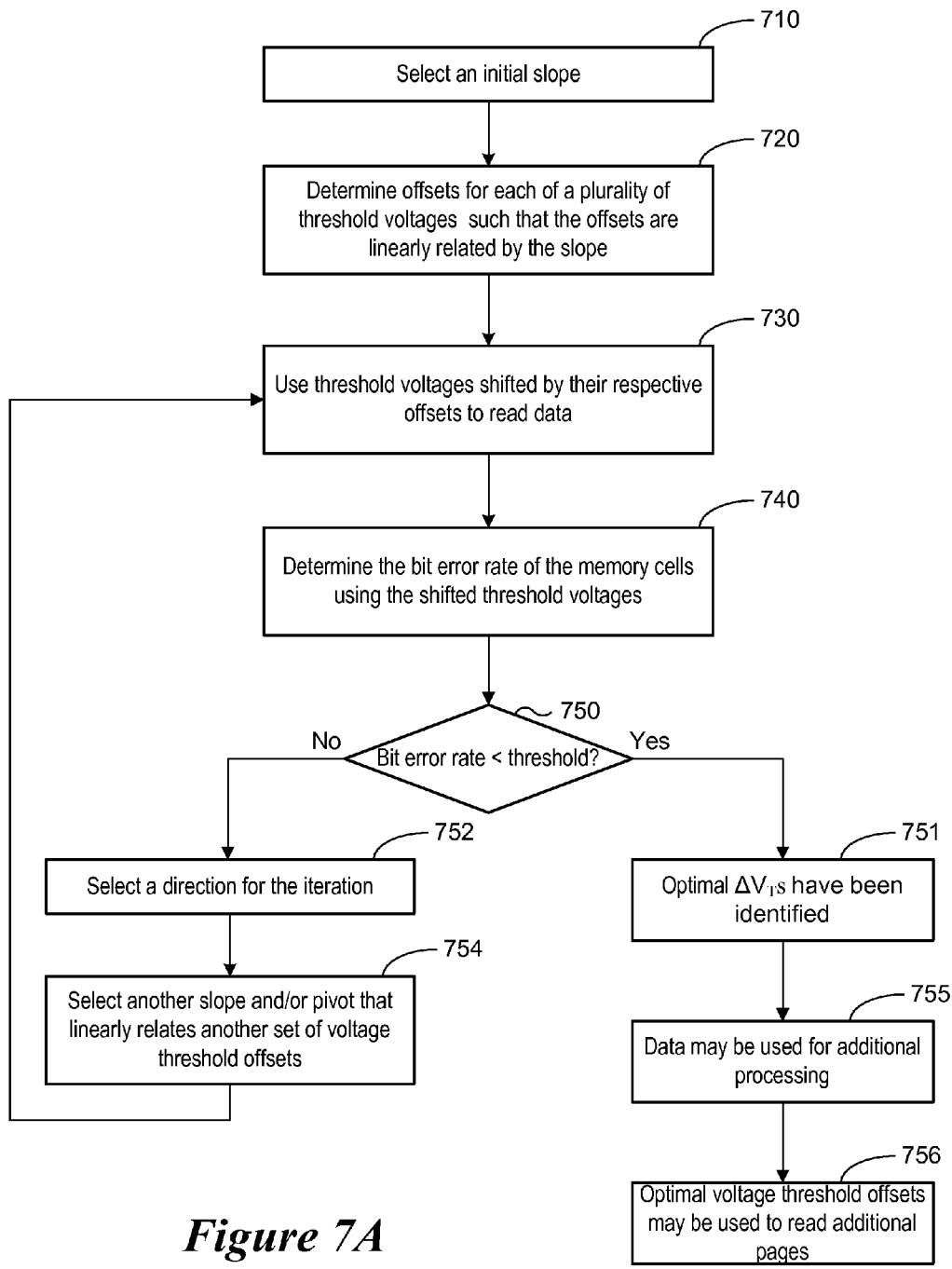
FIG. 7A is a flow diagram that provides a method for on the fly voltage threshold optimization.
Figure 7B:
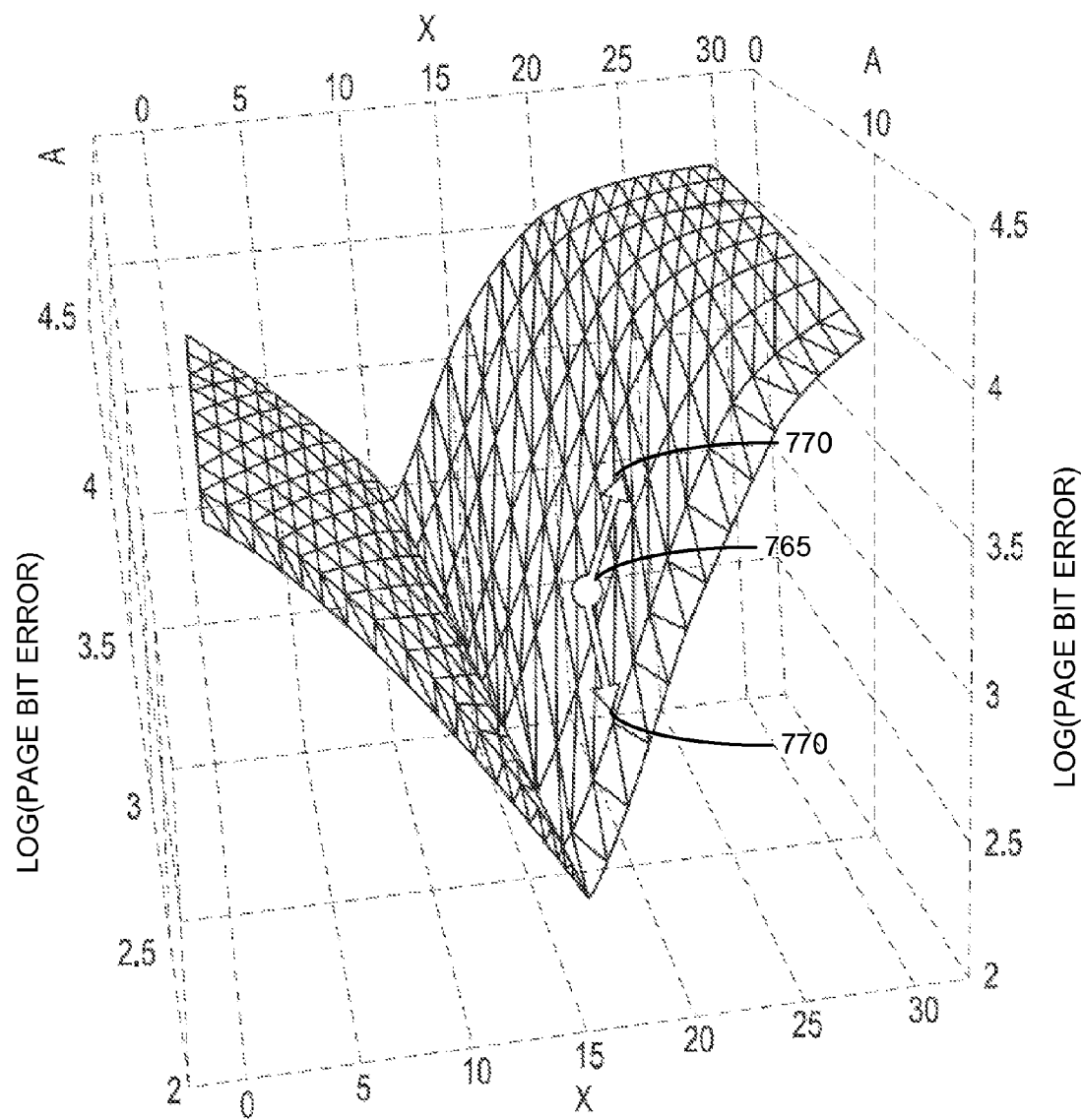
FIG. 7B is a graphical representation of the process provided in FIG. 7A.

According to various implementations, an on-the-fly threshold voltage optimization is performed during operation of the device. FIG. 7A is a flow diagram that provides a method that can be implemented by a memory controller in accordance with some embodiments. FIG. 7B is a graphical representation of the process provided in FIG. 7A. An iterative threshold voltage optimization begins using an initial slope and pivot. The initial slope and pivot be selected 710, 765 from a look up table, for example. Threshold voltage offsets $\Delta V_T$s for each of a plurality of threshold voltages $V_T$s are determined 720 wherein the threshold voltages offset are linearly related by the slope and pivot. The threshold voltages, $V_T$s, are shifted by their respective offsets, $\Delta V_T$s, and are used to read data 730. The BER of the memory cells is determined 740 from the data read using the shifted threshold voltages. If it is determined 750 that the BER is less than a predetermined threshold, the optimal $\Delta V_T$s have been identified 751. The data may be used 755 for additional processing. The optimal $\Delta V_T$s may be used to read additional memory cells, e.g., additional pages.

If it is determined 750 that the BER is not less than the threshold, a direction is selected 752, 770, e.g., from a look up table, for the next iteration. The next slope and/or pivot value used in the iteration is increased or decreased according to the selected direction.

In the selected direction, another slope and/or pivot value is determined 754 that linearly relate another set of $\Delta V_T$s. The slopes and/or pivots for each iteration may be determined by increasing or decreasing an initial or previously used slope and/or pivot according to the direction. For example, the slopes for the iterations may be determined by adding or subtracting an amount to or from an initial or previously used slope. The pivot values for the iterations may be determined by adding or subtracting an amount to or from an initial or previously used pivot. The amounts added to or subtracted from the initial or previously used slopes and/or pivots can be based on one or more operating parameters of the memory cells. For example, the amount may be based on the number of PE cycles of the cells, previously measured BER, retention time, one or more previously used slopes and/or pivots, and/or a slope and/or pivot used by an adjacent page or other memory unit. In some implementations, the amount that is added or subtracted from a previously used slope and/or pivot may be between about 3% to about 10% of the values of the previously slope and/or pivot, for example. In some cases, the iterated slope and/or pivot values may be selected by adding or subtracting a predetermined fixed increment to a previously used slope or pivot, for example.

The $\Delta V_T$s determined for each iteration are used to shift the $V_T$s and the data is read 730 using the shifted $V_T$s. The BER of the memory cells is determined 740 using the data read using the shifted $V_T$s. This iterative process may continue until $V_T$s that are shifted by respective $\Delta V_T$s produce an optimal BER that is less than the threshold and/or until $\Delta V_T$s that provide a minimum BER are identified.

In methods that determine optimal $V_T$s, more than one BER threshold may be used. For example, there can be one BER threshold that is the maximum BER allowed. Another BER threshold can also be developed that represents better performance. In some cases, the optimal $\Delta V_T$s are those that result in a BER less than the maximum BER threshold. The maximum BER threshold may be used, for example, in cases where efficiency is favored over performance and/or where the memory cells are nearing the end of life. The maximum BER threshold may be used, for example, when the determination to find the slope with a lower BER has gone through a predetermined number of iterations, for example. If the process has not gone through the predetermined number of iterations, a lower BER may be attempted which provides optimal $\Delta V_T$s that achieve a BER less than the lower BER threshold.

According to various implementations, one or more direction corrections may occur during the iteration process. For example, a direction correction may occur after an iteration subsequent to the initial iteration, e.g., after the second, third, fourth iteration. In these implementations, a subsequent BER for the memory cells is determined using $V_T$s shifted by $\Delta V_T$s linearly related by a second slope and/or pivot. A determination is made as to whether the subsequent BER is less than a previous BER. If it is determined that the subsequent BER is less than the previous BER, a direction for iteration of slope and/or pivot values is chosen in the direction of decreasing BER.

In some implementations that seek the global minimum BER, the step size of the iteration may be changed after the direction correction to provide a coarse and fine adjustment of the $\Delta V_T$s. For example, the step size may be larger during a first group of iterations as the BER decreases and then begins to increase, indicating that the global minimum has been passed. When the BER begins to increase, the direction may be changed and the iteration step size may be decreased to provide a fine adjustment to facilitate identification of the minimum BER.

In some implementations, the iterations for the slope and pivot value may be nested. For example, in a first outer iteration, a slope is selected and the pivot value may be iterated in a number of inner iteration loops to determine the lowest BER for the slope. Additional outer iterations may be implemented by changing the slope then iterating the pivot value in the inner loop. These outer and inner iterations may continue until an optimal $\Delta V_T$s is determined or until the minimum BER is determined.

Figure 8A:
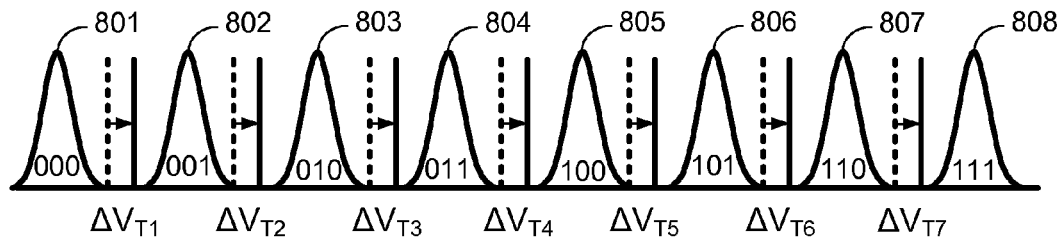
FIG. 8A shows the voltage distribution of data stored a three-bit per cell multi-level memory cell (MLC) device.

Some memory cells can store more than two bits per cell, these cells use more than three threshold voltages to read the cells. For example, in a three bit cell, there would be seven threshold voltages to consider. FIG. 8A shows the voltage distributions of data stored a three-bit per cell MLC device. Voltage distribution 801 is associated with the voltage level corresponding to symbol 000, voltage distribution 802 is associated with the voltage level corresponding to symbol 001, voltage distribution 803 is associated with the voltage level corresponding to symbol 010, voltage distribution 804 associated with the voltage level corresponding to symbol 011, voltage distribution 805 is associated with the voltage level corresponding to symbol 100, voltage distribution 806 is associated with the voltage level corresponding to symbol 101, voltage distribution 807 is associated with the voltage level corresponding to symbol 110, voltage distribution 808 is associated with the voltage level corresponding to symbol 111. Optimal voltage threshold offsets $\Delta V_{T1-7}$ which are linearly related by a slope and pivot, e.g., non-zero slope, may be applied to the voltage thresholds to reduce the BER of the three bit MLC.

Figure 8B:
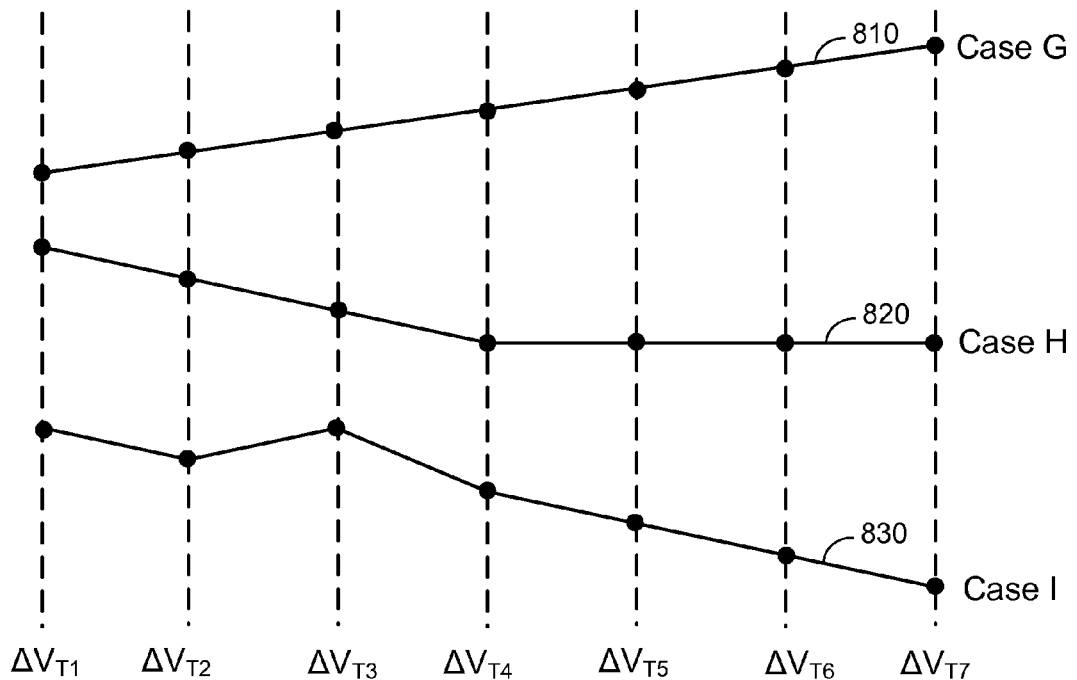
FIG. 8B illustrates three ways in which the threshold voltages can be optimized in a three-bit per cell MLC device according to embodiments described herein.

A similar technique to determine optimal threshold voltage offset as previously described for threshold voltages for two bit cells can be applied to the threshold voltages for three bit cells in accordance with various embodiments. For example, FIG. 8B illustrates three ways in which the threshold voltages can be optimized according to embodiments described herein. Case G 810 illustrates the example wherein all the threshold voltage offsets are linearly related by the same slope and pivot. In some cases, not all of the threshold voltage offsets have the same slope and pivot. For example, Case H 820 and Case I 830 show situations in which a first group of threshold voltage offsets are linearly related by a first slope and a first offset and another group of threshold voltage offsets are linearly related by a second slope and a second offset. Case H 820 shows an example in which the threshold voltage offsets $\Delta V_{T1}$, $\Delta V_{T2}$, $\Delta V_{T3}$, and $\Delta V_{T4}$ are related by a first non-zero slope and a first offset. The remaining voltage threshold offsets, $\Delta V_{T5}$, $\Delta V_{T6}$ and $\Delta V_{T7}$ are all equal to $\Delta V_{T4}$. Case I 830 illustrates an example in which the threshold voltage offsets, $\Delta V_{T1}$, $\Delta V_{T2}$, and $\Delta V_{T3}$ are chosen independently (are not all linearly related by a slope and pivot) of each other and the threshold voltage offsets $\Delta V_{T4}$, $\Delta V_{T5}$, and $\Delta V_{T7}$ are linearly related by a slope and pivot.

Although the subject matter has been described in language specific to structural features and/or methodological acts, it is to be understood that the subject matter defined in the appended claims is not necessarily limited to the specific features or acts described above. Rather, the specific features and acts described above are disclosed as representative forms of implementing the claims.

What is claimed is:

1. A method for use with multi-level memory cells, comprising:
    determining threshold voltage offsets for threshold voltages, the threshold voltage offsets being linearly related by a non-zero slope;
    shifting threshold voltages using their respective threshold voltage offsets; and
    using the threshold voltages shifted by their respective threshold voltage offsets to read data from the multi-level memory cells.

2. The method of claim 1, wherein the threshold voltage offsets are associated with an optimal BER for the memory cells.

3. The method of claim 1, wherein:
    determining threshold voltage offsets comprises:
        determining a bit error rate (BER) of the multi-level memory cells read using the shifted threshold voltages; and
        determining if the BER is less than a predetermined value.

4. The method of claim 1, wherein the threshold voltage offsets are linearly related by the slope and a pivot.

5. The method of claim 4, wherein determining the threshold voltage offsets comprises determining at least one of the slope and pivot value that provides the threshold voltage offsets associated with an optimal BER that is less than a predetermined BER.

6. The method of claim 4, wherein determining the threshold voltage offsets comprises determining at least one of the slope and pivot value that provides the threshold voltage offsets associated with an optimal BER that is a global minimum BER.

7. The method of claim 1, wherein determining the threshold voltage offsets comprises:
    iteratively selecting values for at least one of the slope and the pivot; and
    iteratively determining at least one of the slope and pivot value that provides the threshold voltage offsets associated with an optimal BER.

8. The method of claim 7, wherein iteratively selecting comprises selecting at least one value for at least one of the slope and pivot based on an operating parameter of the memory cells.

9. The method of claim 7, wherein iteratively selecting comprises selecting at least one value for at least one of the slope and pivot from a look up table.

10. The method of claim 1, wherein:
    determining the threshold voltage offsets comprises selecting first threshold voltage offsets that are linearly related by a slope;
    shifting the threshold voltages by the first threshold voltage offsets;
    determining a BER of the multi-level memory cells read using the shifted threshold voltages;
    determining if the BER is an optimal BER; and
    if the bit error rate is non-optimal, iteratively selecting one or more additional slopes that linearly relate one or more additional threshold voltage offsets for each of the threshold voltages, shifting the threshold voltages by the additional threshold voltage offsets.

11. The method of claim 10, wherein iteratively selecting comprises selecting a direction for the iteration; and
    iteratively selecting at least some of the one or more additional slopes in the selected direction.

12. A method of determining threshold voltages for multi-level memory cells, comprising:
    selecting a slope and pivot that linearly relate a set of threshold voltage offsets for a set of threshold voltages;
    reading data from the multi-level memory cells using threshold voltages shifted by their respective threshold voltage offsets;
    determining a bit error rate (BER) of the multi-level memory cells read using the shifted threshold voltages;
    determining if the BER is an optimal BER; and
    if the BER is non-optimal, iteratively performing:
        selecting an additional slope and pivot that linearly relate one or more additional threshold voltage offsets; and
        determining the bit error rate using the set of threshold voltages shifted by the additional threshold voltage offsets.

13. The method of claim 12, wherein determining if the bit error rate is an optimal bit error rate comprises comparing the bit error rate to a predetermined BER.

14. A memory controller, comprising:
    a threshold voltage analyzer configured to determine a set of threshold voltage offsets for a set of threshold voltages for multi-level memory cells, the set of threshold voltage offsets being linearly related by a non-zero slope; and
    a memory interface configured to send information about the shifted threshold voltage offsets to memory read circuitry and to receive data read from the memory cells using the set of threshold voltages shifted by their respective threshold voltage offsets.

15. The memory controller of claim 14, wherein the set of threshold voltages shifted by the set of threshold voltages offsets provide an optimal BER.

16. The memory controller of claim 14, wherein the threshold voltage analyzer is configured to iteratively determine sets of threshold voltage offsets until an optimal BER is achieved, each set of threshold voltage offsets linearly related by slope and pivot.

17. The memory controller of claim 16, wherein the threshold voltage analyzer is configured to determine the sets of threshold voltage offsets by iteratively determining the slope and pivot for the iteration.

18. The memory controller of claim 17, further comprising a look up table, wherein the threshold voltage analyzer is configured to select one or both of a slope and pivot for the iteration from the look up table.

19. The memory controller of claim 17, wherein the threshold voltage analyzer is configured to select one or both of a slope and pivot for the iteration based on one or more operating parameters of the memory cells.

20. The memory controller of claim 19, wherein an operating parameter comprises one or more of a number of PE cycles experienced by the memory cells, a previously measured bit error rate of the memory cells, a retention time, a previously used slope, and a slope used by an adjacent page.

* * * * *